(12) United States Patent
Park et al.

(10) Patent No.: US 7,361,435 B2
(45) Date of Patent: Apr. 22, 2008

(54) METHOD OF CREATING A LAYOUT OF A SET OF MASKS

(75) Inventors: Chul-Hong Park, Kyungki-do (KR);
Moon-Hyun Yoo, Kyungki-do (KR);
Yoo-Hyon Kim, Seoul (KR);
Dong-Hyun Kim, Seoul (KR);
Soo-Han Choi, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/289,204

(22) Filed: Nov. 28, 2005

(65) Prior Publication Data

US 2006/0099522 A1    May 11, 2006

Related U.S. Application Data

(62) Division of application No. 10/302,529, filed on Nov. 22, 2002, now Pat. No. 6,998,199.

(30) Foreign Application Priority Data

Aug. 28, 2002 (KR) .................................. 02-51194

(51) Int. Cl.
G03F 1/00 (2006.01)
G03F 1/14 (2006.01)
G06F 17/50 (2006.01)

(52) U.S. Cl. ............................. 430/5; 716/19

(58) Field of Classification Search .................... 430/5; 716/19
See application file for complete search history.

(56) References Cited

U.S. PATENT DOCUMENTS 5,837,405 A * 11/1998 Tomofuji et al. ............... 430/5
5,858,580 A * 1/1999 Wang et al. ................... 430/5

* cited by examiner

Primary Examiner—Mark F. Huff
Assistant Examiner—John Ruggles
(74) Attorney, Agent, or Firm—Marger Johnson & McCollom, P.C.

(57) ABSTRACT

A method of creating a layout of a set of masks including an alternating phase shifting mask (APSM) and a halftone phase shifting trim mask (HPSTM) is provided. The APSM includes first and second phase shifting areas and a first opaque pattern. The first and second phase shifting areas are disposed adjacent to each other and have different phases for generating destructive interference. Further, the first and second phase shifting areas define an access interconnection line. The first opaque pattern is formed on a transparent substrate to define the first and second phase shifting areas. The HPSTM includes a second opaque pattern on the transparent substrate and a halftone pattern. The second opaque pattern prevents an access interconnection line from being erased. The halftone pattern defines a pass interconnection line connected to the access interconnection line.

12 Claims, 12 Drawing Sheets

METHOD OF CREATING A LAYOUT OF A SET OF MASKS

This application is a Divisional of U.S. patent application Ser. No. 10/302,529, filed Nov. 22, 2002, now U.S. Pat. No. 6,998,199 issued on Feb. 14, 2006, which claims priority from Korean Patent Application No. 2002-51194, filed Aug. 28, 2002, which is incorporated by reference in its entirety.

BACKGROUND OF THE INVENTION

1. Field of the Invention

The present invention relates to masks for manufacturing a highly-integrated circuit device, a method of creating a layout of the mask, a method of manufacturing the mask and a method of manufacturing the highly-integrated circuit device using the mask.

2. Description of the Related Art

As the integration density of semiconductor devices increases, design rules are scaled down into the deep submicron range and under. However, the smaller the size of the pattern, the less resolution the pattern has due to optical proximity effects between adjacent patterns.

If the numerical aperture is increased to increase the resolution of an optical apparatus, the depth of focus (DOF) is undesirably decreased. Thus, a phase shift mask (PSM) for shifting and interfering with a wavelength of light transmitted through the mask has been introduced to improve the resolution.

U.S. Pat. No. 5,858,580 discloses a mask minimizing a gate line width of a transistor using the characteristics of a PSM. In this reference, the PSM defines the gate on an active area and a single phase structure mask (SPSM) defines remaining interconnection structures. A semiconductor substrate is exposed using PSM and the SPSM (double-exposed) so that the gate line width on the active area can be reduced compared to the prior art method.

In the set of masks disclosed in U.S. Pat. No. 5,858,580, however, only a single straight line type gate pattern is defined on the active area by the PSM, while the remaining interconnection structures are defined by a chrome pattern of the SPSM. Thus, with the prior art method described above using the PSM and the SPSM masks, the gate line width on the active area can be reduced compared to the conventional gate line width. But the line width of the remaining interconnection structures connecting the remaining gates has not been reduced as desired. Therefore, it is difficult to form the highly-integrated device on a small chip area using the prior art techniques.

SUMMARY OF THE INVENTION

To solve the above-described problems, the present invention provides, among other things, a set of masks capable of substantially reducing the line width of interconnections of a highly-integrated circuit device.

The present invention also provides a method of creating a layout of the set of masks.

Additionally, the present invention provides a method of manufacturing the set of masks.

In addition, the present invention provides a method of manufacturing a highly-integrated circuit device using the set of masks.

According to an aspect of the present invention, a set of masks comprises an alternating phase shifting mask (APSM) and a halftone phase shifting trim mask (HPSTM).

The APSM includes first and second phase shifting areas and a first opaque pattern. The first and second phase shifting areas are disposed adjacent to each other and have different phases for generating destructive interference. Further, the first and second phase shifting areas define an access interconnection line. The first opaque pattern is formed on a transparent substrate to define the first and second phase shifting areas.

The HPSTM includes a second opaque pattern on the transparent substrate, and a halftone pattern. The second opaque pattern prevents an access interconnection line from being erased. The halftone pattern defines a pass interconnection line connected to the access interconnection line.

According to another aspect of the present invention, a method of creating a layout of a set of masks is provided. After reading the layout data of an interconnection line having a large line width, an area in which an access interconnection line is formed to have a line width smaller than the large line width by destructive interference is identified from the read layout data. Next, a layout of an APSM having first and second phase shifting areas is created based on the identification. The first and second phase shifting areas have different phases and are disposed adjacent to each other to generate destructive interference. Finally, a layout of a HPSTM having an opaque pattern and a halftone pattern is created. The opaque pattern prevents the access interconnection line defined by the APSM from being erased. The halftone pattern defines a pass interconnection line, which has a line width smaller than the large line width, and is connected to the access interconnection line.

According to a further aspect of the present invention, a method of creating a layout of a set of masks is provided. After creating the layouts of the APSM and the HPSTM using the same processes, the method further comprises creating a layout of a virtual layer that defines a boundary of the opaque pattern and the halftone pattern considering a misalignment margin of an HPSTM manufacturing apparatus.

According to yet another aspect of the present invention, a method of manufacturing a HPSTM is provided. After sequentially forming a halftone film and an opaque film on a transparent substrate, the opaque film and the halftone film are sequentially patterned according to a layout of the opaque pattern and the halftone pattern. Next, the patterned opaque film is repatterned according to only a layout of the opaque pattern to complete the HPSTM.

According to still another aspect of the present invention, a method of manufacturing a HPSTM is provided. After sequentially forming a halftone film and an opaque film on a transparent substrate, the opaque film and the halftone film are sequentially patterned according to a layout of the opaque pattern and the halftone pattern. Next, the patterned opaque film is repatterned according to only a layout of a virtual layer that defines a boundary of the opaque pattern and the halftone pattern, considering a misalignment margin of a HPSTM manufacturing apparatus to complete the HPSTM.

According to another aspect of the present invention, a method of manufacturing a highly-integrated circuit device is provided. A wafer formed of sequentially stacked interconnection material layers and a photoresist layer to be sequentially patterned is exposed using an APSM. Next, the exposed wafer is exposed using a HPSTM.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

A set of masks, a method of creating a layout for the set of masks, a method of manufacturing the set of masks and a method of manufacturing a highly-integrated circuit device using the set of masks are described in detail with reference to the accompanying drawings. The present invention may be, however, embodied in many different forms and should not be construed as being limited to the embodiments set forth herein; rather, these embodiments are provided so that this disclosure will be thorough and complete and will fully convey the concepts of the invention to those skilled in the art. In the drawings, sizes of patterns on a mask substrate are exaggerated for clarity. It will also be understood that a mask image is referred to as a transcribed image on a wafer coated with a photoresist film when exposing the wafer using the mask. Further, the same reference symbols represent the same elements, and their descriptions will not be repeated.

Figure 1:
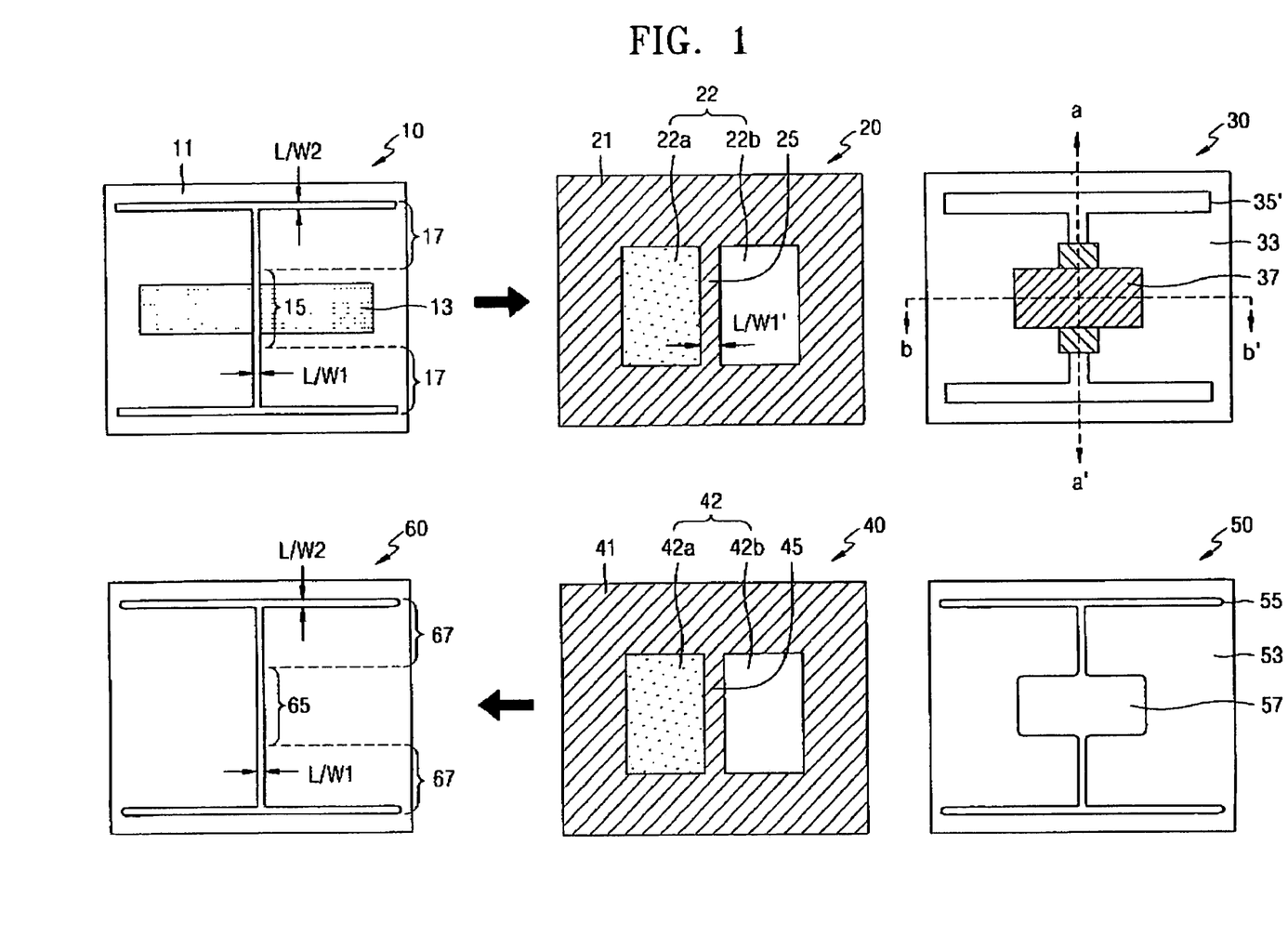
FIG. 1 is a layout of a set of masks and illustrates a process diagram illustrating formation of an interconnection of minimum line width, using the set of masks, according to an embodiment of the present invention.

Referring to FIG. 1, a set of masks, with which the line width of an interconnection line of a highly-integrated circuit device is substantially reduced over an entire chip, and a method of generating an interconnection image of a substantially reduced line width using the set of masks will be described.

In the specification, an interconnection line directly associated with the circuit device operation is referred to as an access interconnection line. An interconnection line primarily functioning as a means of signal transmission by connecting a plurality of access interconnections is referred to as a pass interconnection line. All of the embodiments of the present invention will explain an example for the case where the interconnection line is a gate line. But the present invention can be applied to different interconnection structures of a highly-integrated circuit device. In order to form a highly-integrated chip pattern in a minimum amount of area, it is desirable that an access gate on an active area have the minimum line width required for transistor operation and that a pass gate on a remaining field area has the minimum line width required for a signal transmission.

FIG. 1 shows a layout 10 of a gate line of the highly-integrated circuit device, a layout of an alternating phase shifting mask (APSM) 20, a layout of a halftone phase shifting trim mask (HPSTM) 30, a plan view of an APSM image 40, a plan view of an HPSTM image 50, and a plan view of a final image 60.

The layout 10 of the gate line of the highly-integrated circuit device includes an access gate 15 having a first line width (L/W1) on an active area pattern 13 that has been already arranged on a wafer 11, and a pass gate 17 having a second line width (L/W2), which is no greater than the first line width (L/W1). The access gate 15 and the pass gate 17 of the layout 10 are formed by the double exposure of the APSM 20 and the HPSTM 30. Here, the HPSTM 30 and the APSM 20 can be formed in any sequence on the final image 60.

First, a set of masks including the APSM 20 and the HPSTM 30 will be described. The APSM 20 includes a pair of phase shifting areas 22 and an opaque pattern 21. The pair of phase shifting areas 22 is comprised of first and second phase shifting areas 22a and 22b. The pair of phase shifting areas 22 are disposed adjacent to each other and have different phases to generate destructive light interference. It is most suitable for destructive light interference if the first phase shifting area 22a is a 0-degree phase transparent area and the second phase shifting area 22b is a 180-degree phase transparent area. The opaque pattern 21 is formed on a transparent substrate (not shown) and defines the pair of phase shifting areas 22.

The APSM 20 is preferably an opaque field APSM, in which an opaque field is alternated, by further including an opaque line pattern 25 between the first phase shifting area 22a and the second phase shifting area 22b. The opaque line pattern 25 has a line width (L/W1') to determine the line width (L/W1) of the access gate 15 along with the light shielding of the opaque line pattern 25 and the destructive light interference caused by the two adjacent areas, i.e., the first phase shifting area 22a and the second phase shifting area 22b.

An unwanted artifact structure due to the destructive light interference can be prevented by minimizing the area to which the APSM 20 is applied. Thus, it is preferable that the APSM 20 be applied only to an area where patterns can be properly formed by the destructive light interference.

The HPSTM 30 includes an opaque pattern 37 formed on a transparent substrate 33, and a halftone pattern 35. The opaque pattern 37 prevents the access gate 15 defined by the APSM 20 from being erased. The halftone pattern 35 defines the pass gate 17 connected to the access gate. Since the halftone pattern 35 has a high resolution and a greater depth of focus (DOF), the pass gate 17 can be formed with the minimum line width. It is preferable that the halftone pattern 35 be composed of a material, such as MoSi and CrOx, in which the transmissivity against an exposure source is more than about 0% and less than about 30% so as to increase pattern resolution.

A method of forming a final gate line image is described using the set of masks according to an embodiment of the present invention. After a material film, for example, a polysilicon film, for forming an interconnection is formed on the wafer 11 in which the active area pattern 13 has been already formed, a photoresist film is coated on the polysilicon film. Next, when the photoresist film is exposed using the APSM 20, an APSM image 40 is formed. Light is transmitted through the pair of phase shifting areas 22 of the APSM 20 to form a 0-degree phase exposure area 42a and a 180-degree phase exposure area 42b. The transmission of light is blocked by the opaque pattern 21, thereby forming a non-exposure area 41. The destructive light interference is generated between the 0-degree phase exposure area 42a and the 180-degree phase exposure area 42b to form an access gate dark line 45. The transmission of light is blocked by the opaque line pattern 25, thereby controlling the line width of the access gate dark line 45. Thus, the width of the opaque line pattern 25 can be controlled in accordance with the width of the access gate dark line 45 to be formed or may even be removed, if necessary.

When the photoresist-coated wafer is exposed using the HPSTM 30, an HPSTM image 50 is formed. The transmission of light is blocked by the second opaque pattern 37 of the HPSTM 30. A non-exposure area 57 defined by the second opaque pattern 37 prevents the access gate dark line 45 of the APSM image from being erased (exposed). Only the light in transmissivity range of more than about 0% and less than about 30% is transmitted through the halftone pattern 35, and the transmitted light is different from the light transmitted through the transparent substrate 33 by 180-degree phase. Thus, the resolution of a non-exposure area 55 defined by the halftone pattern 35 is increased. The non-exposure area 55 defines a pass gate dark line 67.

The double exposures are performed using APSM 20 and HPSTM 30 in any sequence to form a final image 60. In the final image 60, an access gate dark line 65 is formed having the first line width L/W1, and the pass gate dark line 67 is formed having the second line width L/W2.

In the set of masks according to an embodiment of the present invention, the access gate 15 is defined by the destructive light interference of the APSM 20 and is protected by the second opaque pattern 37 of the HPSTM 30. If the access gate dark line 45 defined by the destructive light interference of the APSM 20 is protected by the halftone pattern 35, the access gate dark line 45 is likely to be partially exposed. Accordingly, the access gate dark line 45 is protected by the second opaque pattern 37 of the HPSTM 30. Further, the connection structure having a minimum line width can be easily realized by defining the pass gate 17 with a halftone pattern having a good DOF.

Figure 2:
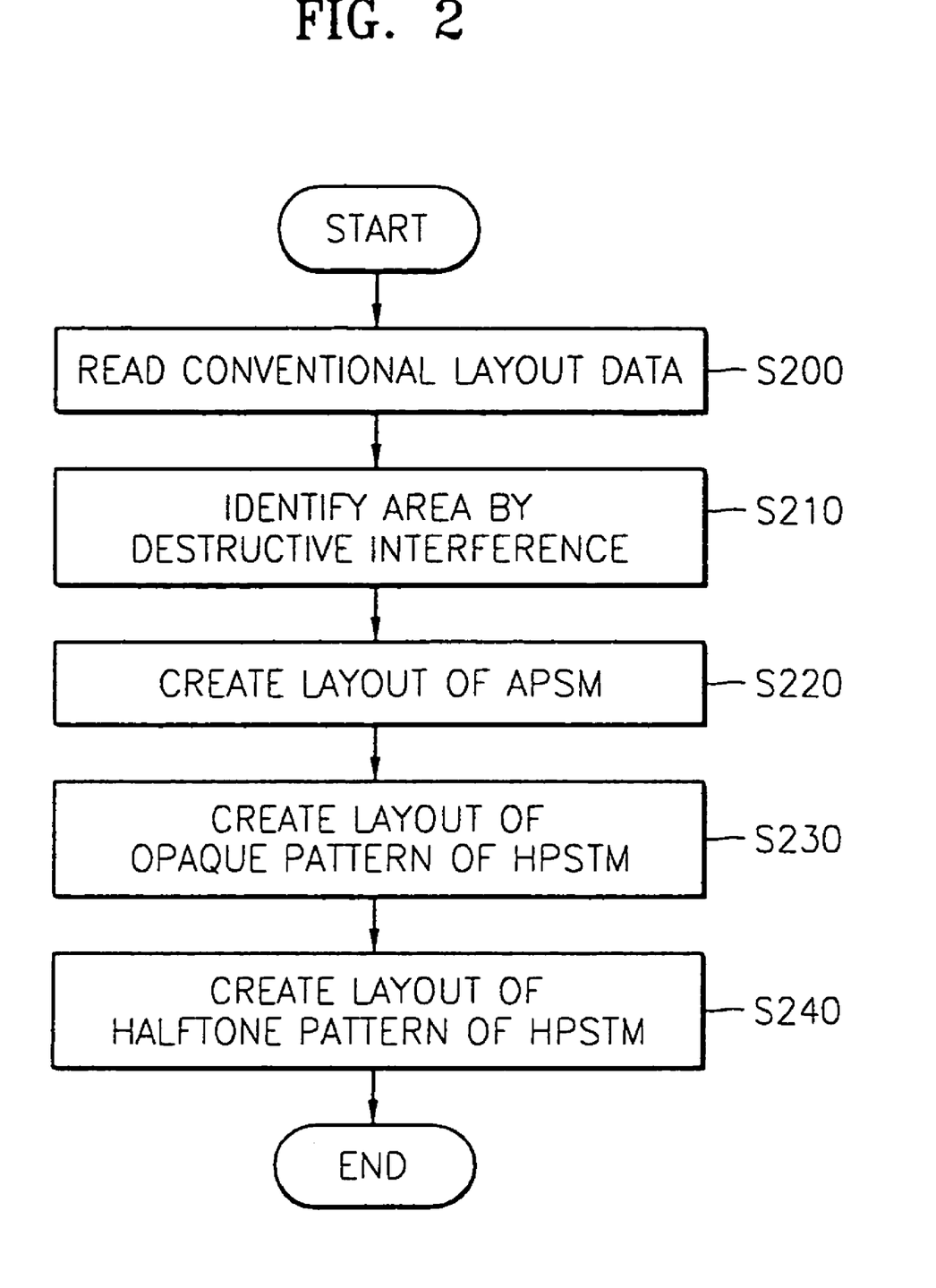
FIG. 2 is a flowchart illustrating a method of creating a layout for the set of masks of FIG. 1.
Figure 3A:
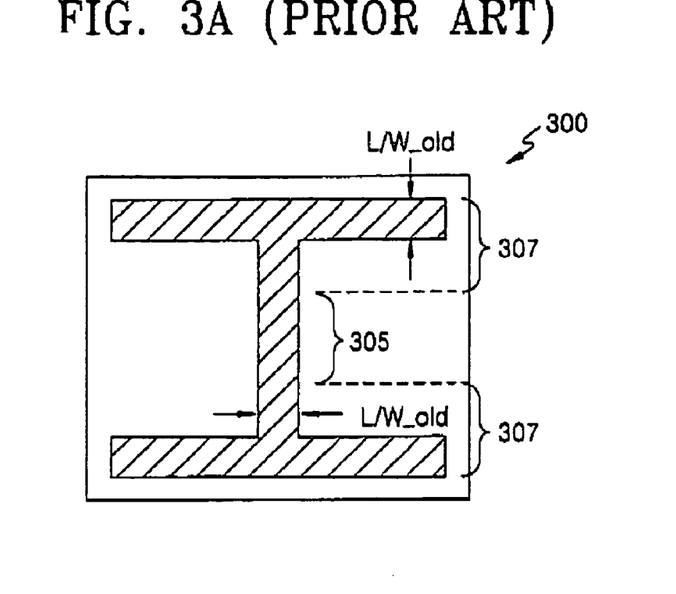
FIG. 3A is a layout of a mask used for manufacturing a set of masks of the present invention according to an embodiment of the present invention.
Figure 3B:
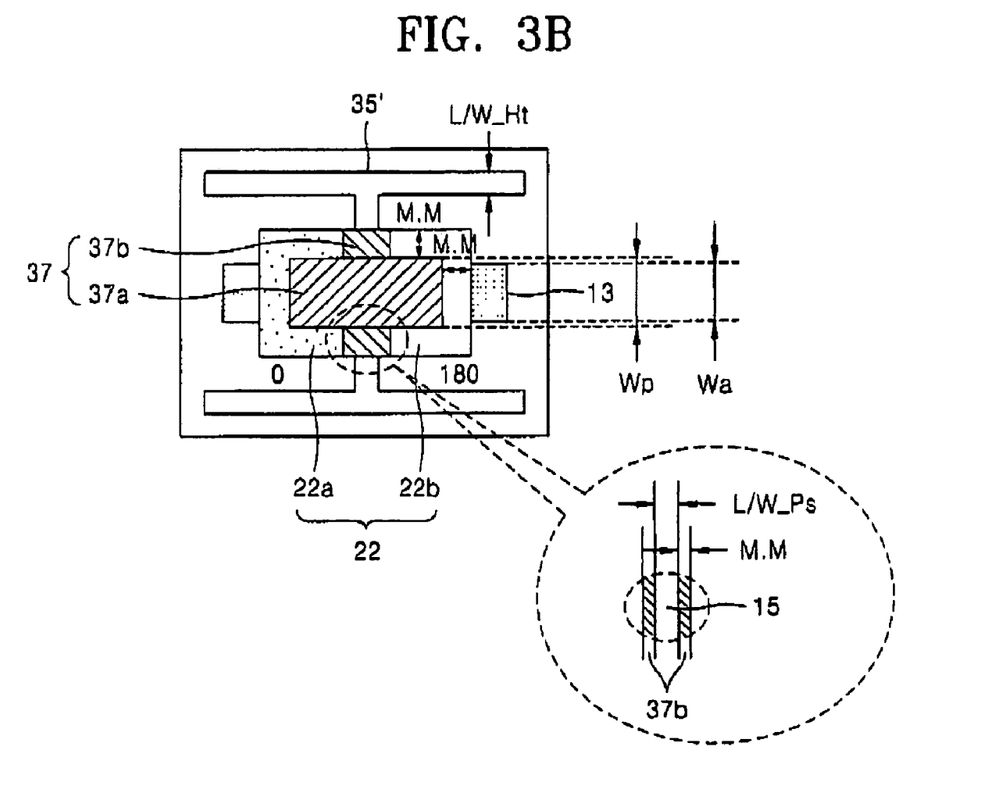
FIG. 3B and FIG. 4 are plan views of an overlapped layout of a set of masks manufactured by the processes of FIG. 2.

FIG. 2 is a flowchart illustrating a method of creating a new layout for a set of masks according to an embodiment of the present invention. FIG. 3A is a layout of the conventional mask for manufacturing the set of masks in accordance with an embodiment of the present invention. FIG. 3B is an overlapped layout of the set of masks manufactured by the processes of FIG. 2.

First, data including the layout of the conventional mask of FIG. 3A is read in step S200 to manufacture a set of masks according to an embodiment of the present invention. Conventional mask data is supplied as a manual data or a file such as a GDS-II file to a computer. The conventional mask 300 is a single chrome mask and includes an access gate 305 having a line width L/W_old and a pass gate 307 having a line width L/W_old, which is same as that of the access gate 305. The line width L/W_old of the conventional mask is larger than that of the mask required for manufacturing a highly-integrated circuit device. The data can include, for example, data on the conventional layout, the conventional line width L/W_old, the access gate line width and the pass gate line width of a new circuit device and shrink factors of the access gate line width and the pass gate line width, and so on.

Next, areas in which the gate line is formed to have a line width smaller than the above line width L/W_old by destructive light interference are identified from the read layout data in the above step S200, in step S210. In the above step S210, areas that cannot be formed by the resolution of the conventional apparatus, are identified, and it is preferable to form the areas by destructive light interference. For example, the access gate area is identified, the minimum line width of the access gate area is determined, and the degree of destructive light interference suitable for the minimum line width of the access gate area is determined.

The layout of the APSM 20 of FIG. 1 is created by disposing a pair of phase shifting areas 22 in an appropriate area within the circuit based on the identifying contents (for example, area and degree of destructive light interference), in step S220. It is preferable to use a computer in the creation of the layout of the APSM 20. (However, the layout of the APSM 20 can be created manually, if necessary.) At this time, the layout data of the APSM 20 created by the computer is input to a mask manufacturing apparatus. The pair of phase shifting areas 22 may be comprised of areas having different phases, e.g., the 0-degree phase shifting area 22a and the 180-degree phase shifting area 22b.

After the layout data of the APSM 20 is created, the layout data of the HPSTM 30 is created by the computer in steps S230 and S240. First, the layout of the opaque pattern 37 of the HPSTM 30 is created corresponding to the area where the pair of phase shifting areas 22 are disposed in the above step S220, in step S230. The size and shape of the opaque pattern 37 are described in detail with reference to FIG. 3B. The opaque pattern 37 corresponds to the pair of phase shifting areas 22 and prevents the access gate 15 defined by the pair of phase shifting areas 22 from being erased. If the size of the opaque pattern 37 is larger than the pair of phase shifting areas 22, part of the final image 60 area, which is formed by double exposure of the set of masks and must be exposed, may not be exposed. The non-exposed part is likely to function as an artifact structure. Thus, it is preferable that the size of the opaque pattern 37 be the same as or smaller than the size of the pair of phase shifting areas 22. More preferably, the opaque pattern 37 is comprised of a main block pattern 37a and a sub-block pattern 37b. The main block pattern 37a has a plurality of edges. The edges are separated from corresponding edges of the first and second phase shifting areas, i.e., four edges of the pair of phase shifting areas 22, by a misalignment margin (M.M) requiring when exposing the APSM 20 (FIG. 1) and the HPSTM 30 (FIG. 1). The sub-block pattern 37b extends from the main block pattern 37a and prevents the access gate 15 from being erased. At this time, the line width Wp of the main block pattern 37a is grater than the line width Wa of the active area 13, thereby maintaining the operational characteristics (for example, threshold voltage) of an active device well.

The line width of the sub-block pattern 37b is greater than the line width L/W_Ps of the access gate 15 by the misalignment margin (M.M) on both sides of the line width L/W_Ps. In other words, the sub-block pattern 37b extends from both sides of the access gate 15 by the misalignment margin. The access gate 15 is defined by a combination of light shielding of the opaque line pattern 25 (FIG. 1) and the destructive light interference of the first phase shifting area 22a and the second phase shifting area 22b. This structure effectively prevents the access gate dark line 65 (FIG. 1) from being erased (exposed).

It is preferable that the sub-block pattern 37b extend from the ends of the main block pattern 37a to the ends of the pair of phase shifting areas 22, that is, aligned with the ends of the pair of phase shifting areas 22. If the sub-block pattern 37b is formed of the halftone pattern rather than the opaque pattern, the sub-block pattern 37b cannot completely prevent the access gate dark line 65 from being erased. Because the halftone pattern is composed of a material having a transmissivity of more than about 0% and less than about 30% and shifts the transmitted light to 180-degrees, the area where the access gate 15 must be formed can be partially exposed due to an interaction between the halftone pattern and the surrounding exposure areas. Thus, it is difficult to control the line width of the access gate dark line 65. Therefore, it is preferable that the sub-block pattern 37b be formed of opaque material and extended to at least the edges of the pair of phase shifting areas 22.

Figure 4:
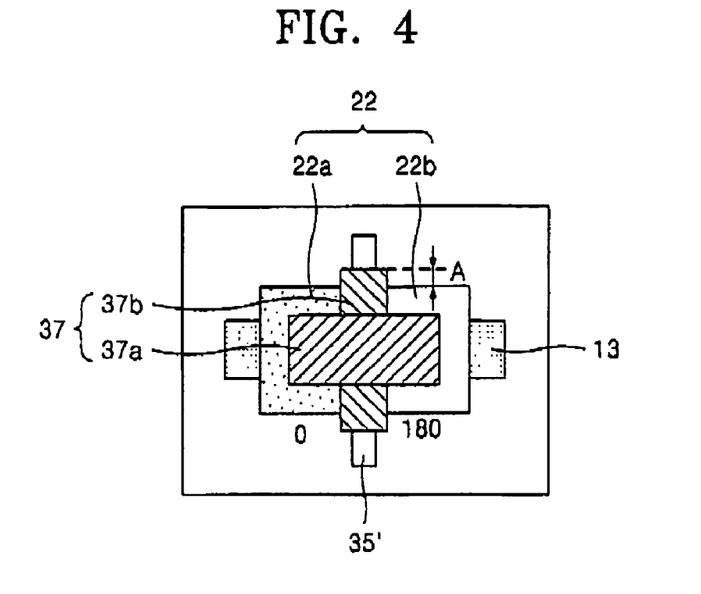

As shown in FIG. 4, the sub-block pattern 37b may extend outwardly from edges of the pair of phase shifting areas 22 by a predetermined length A. At this time, if the extended length A exceeds the wavelength of the exposure source, a boundary of the halftone pattern 35 and the sub-block pattern 37b can be cut off when the DOF is changed. Thus, it is preferable that the extended length A of the sub-block pattern 37b be no greater than the wavelength of the exposure source used for the set of masks. Specifically, the extended length A is 248 nm when using a KrF excimer laser as the exposure source, 193 nm when using a ArF excimer laser as the exposure source, and 157 nm when using a F2 excimer laser as the exposure source.

After the opaque pattern 37 layout is created, the computer analyzes the layout created in the above steps and the conventional layout. Then, an area on which the pass gate 17 connected to the access gate 15 is formed and the size of the contracted pass gate 17 are determined to create the halftone pattern 35 layout in step S240. The computer creates the layout data of the HPSTM as GDS-II data type, and the layout data are input to the mask manufacturing apparatus as the layout data of the APSM 20.

Figure 5:
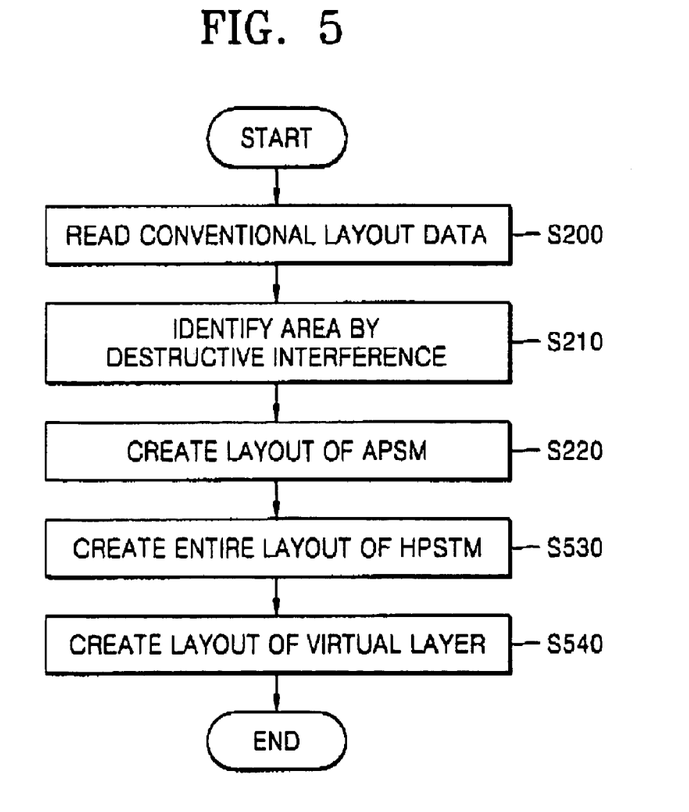
FIG. 5 is a flowchart illustrating a method of creating the layout of the set of masks of FIG. 1 according to another embodiment of the present invention.
Figure 6:
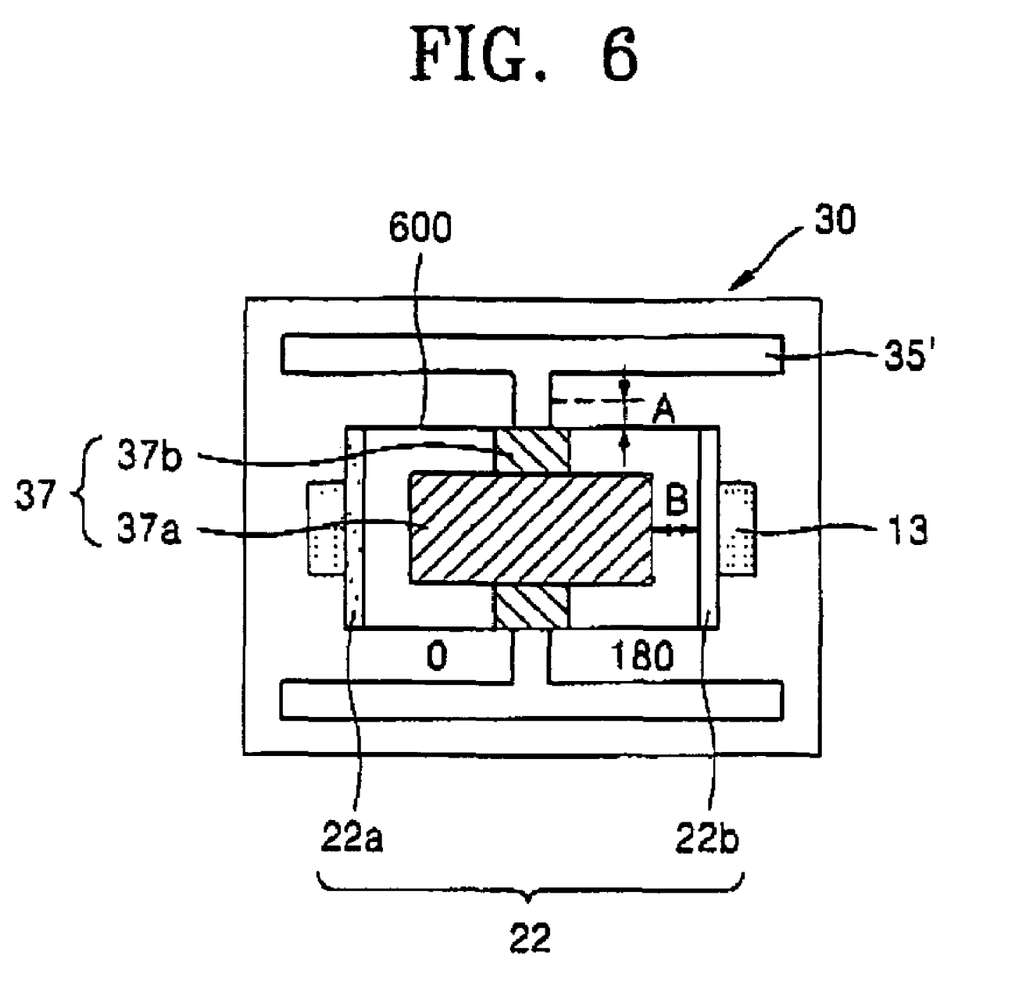
FIG. 6 is a plan view of an overlapped layout of a set of masks manufactured by the processes of FIG. 5.

FIG. 5 is a flowchart illustrating a method of creating the layout of the set of masks according to another embodiment of the present invention, and FIG. 6 is an overlapped layout of the set of masks manufactured by the processes of FIG. 5.

Steps S200, S210 and S220 for manufacturing the APSM 20 is the same as the steps shown in the flowchart of FIG. 2. Next, an entire layout of the HPSTM 30 is created in step S530. The opaque pattern 37 of the HPSTM 30 is disposed on the area where the phase shifting areas are disposed in the above step, and the size of the opaque pattern 37 is determined. By analyzing the conventional layout, the area where the pass gate 17 is connected to the access gate 15 is formed and the size of the contracted pass gate are determined. Using this analysis, the halftone layout of the HPSTM 30 is created in step S530, completing the design of the HPSTM 30. The computer creates the layout data of the HPSTM 30 as GDS-II data type, and the data are input to the mask manufacturing apparatus as the design data of the APSM 20.

Finally, layout data of a virtual layer 600 of the HPSTM is created in step S540. Referring the FIG. 6, the virtual layer 600 distinguishes the opaque pattern 37 and the halftone pattern 35 of the HPSTM 30 and increases the misalignment margin required for the mask manufacture. Preferably, a portion of the edges of the virtual layer 600 aligns with the common boundary area of the sub-block pattern 37b (of the opaque pattern 37) and the halftone pattern 35. The edge of the main block pattern 37a of the HPSTM 30 is preferably separated from the edge of the virtual layer 600 by the length of a misalignment margin B of the apparatus used in manufacturing the HPSTM 30, thereby increasing the manufacturing margin of the mask.

Hereinafter, functions of the virtual layer 600 will be described in detail by the following description of the mask manufacturing processes.

FIGS. 7A to 7I are cross-sectional views taken along a-a' and b-b' of FIG. 1 and top views illustrating the mask manufacturing processes using the layout data input to the mask manufacturing apparatus, according to an embodiment shown in the flowchart of FIG. 2.

Figure 7A:
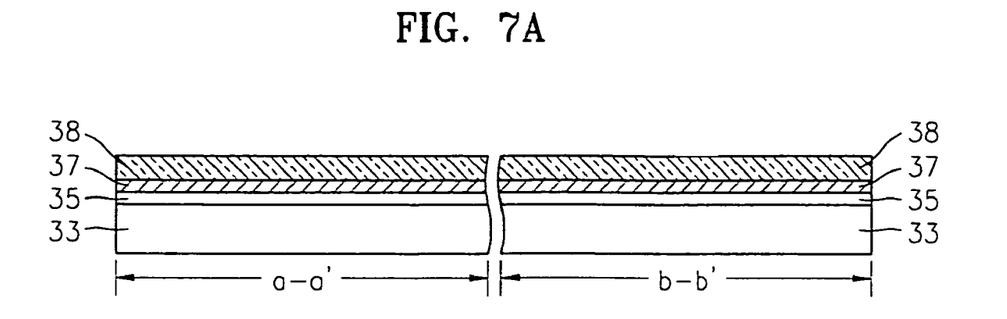
FIGS. 7A to 7I are cross-sectional views and top views illustrating processes of manufacturing the masks using layout data input to a mask manufacturing apparatus through the flowchart of FIG. 2.

Referring to FIG. 7A, a halftone film 35, an opaque film 37, and a first photoresist film 38 are sequentially formed on the transparent substrate 33. The halftone film 35 is formed using MoSi or CrOx having transmissivity of more than about 0% and less than about 30%. The thickness of the halftone film 35 satisfies the following equation:

$t=\lambda/2/(n_2-n_1)$

In the above equation, $n_1$ indicates the refractive index of air; and $n_2$ indicates the refractive index of the halftone film.

The opaque film 37 is preferably formed using a Cr layer, but can be formed using any other suitable materials.

Figure 7B:
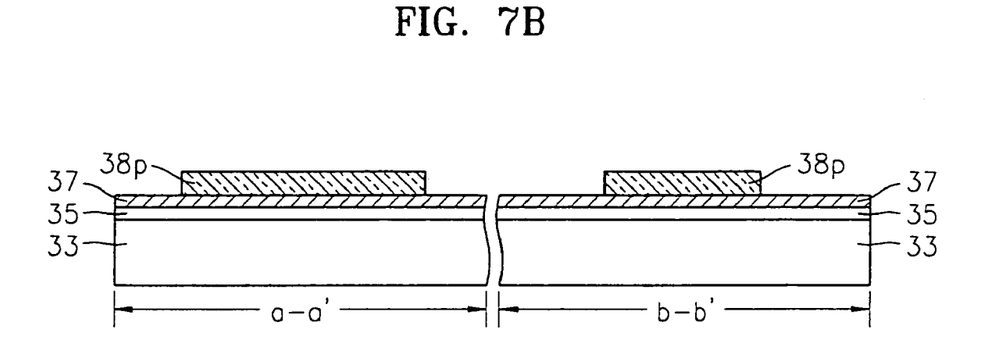
Figure 7C:
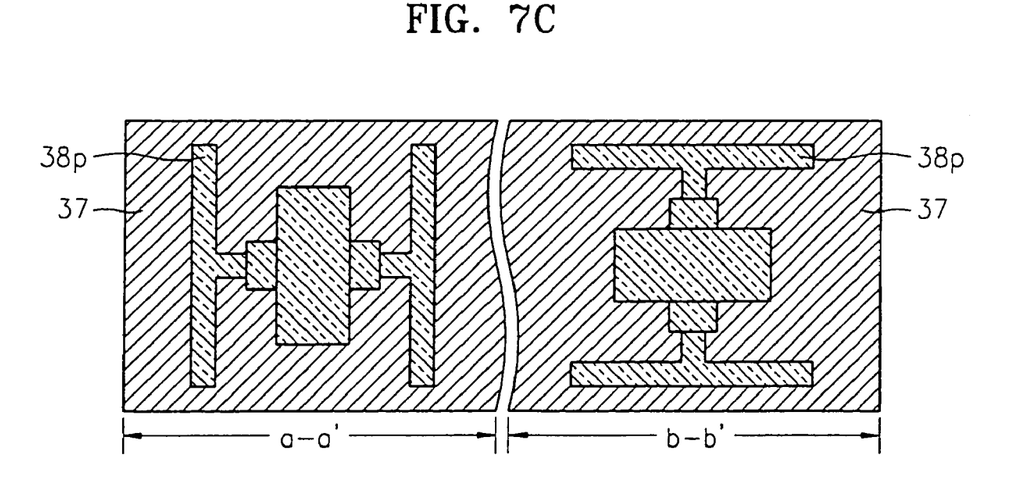

Now turning to FIG. 7B, the first photoresist pattern 38p is formed using an E-beam apparatus for manufacturing a mask. The first photoresist pattern 38p is formed with the layout data overlapping the opaque pattern layout and the halftone pattern layout of the HPSTM 30 created according to steps S230 and S240 of FIG. 2. A top view of the thus formed photoresist pattern 38p is shown in FIG. 7C.

Figure 7D:
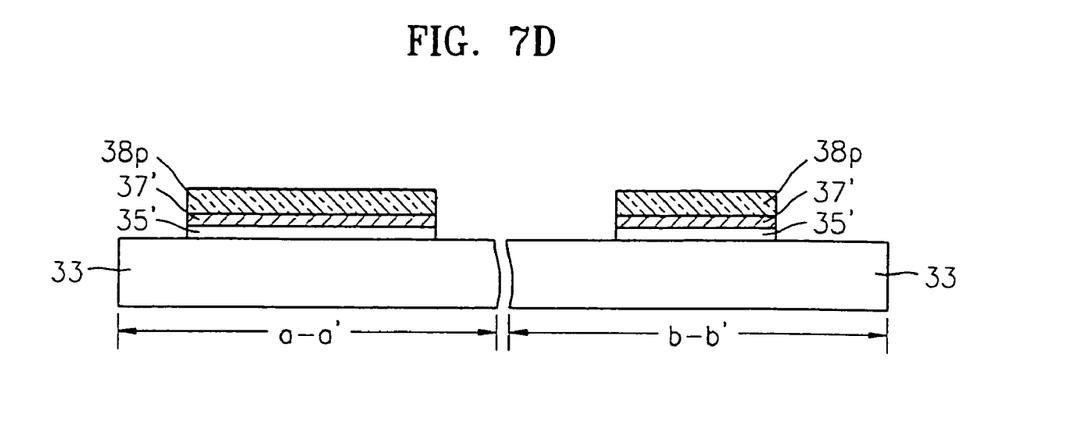

Referring to FIG. 7D, the opaque film 37 and the halftone film 35 are sequentially patterned using the first photoresist pattern 38p as an etching mask so that an opaque pattern 37' and a halftone pattern 35' are formed.

Figure 7E:
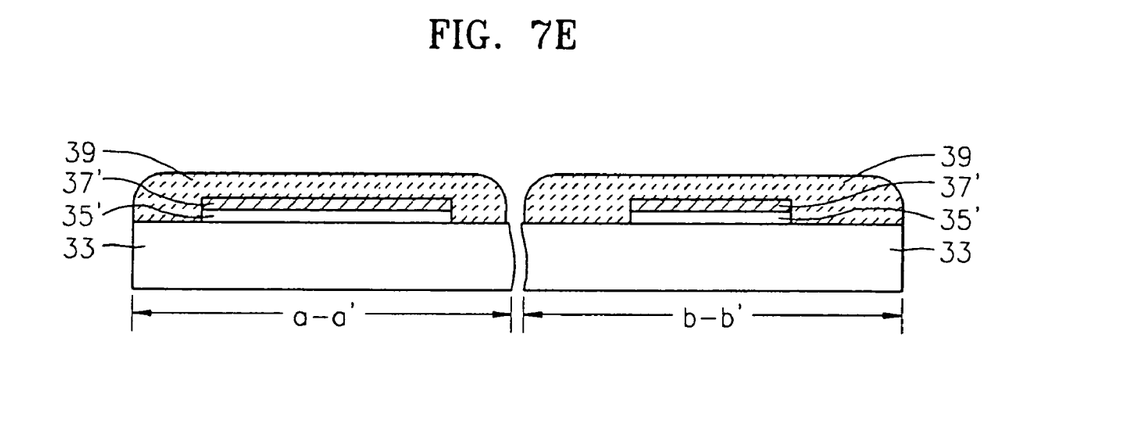

Referring to FIG. 7E, a second photoresist film 39 is formed on the resulting structure, after removing the first photoresist pattern 38p.

Figure 7F:
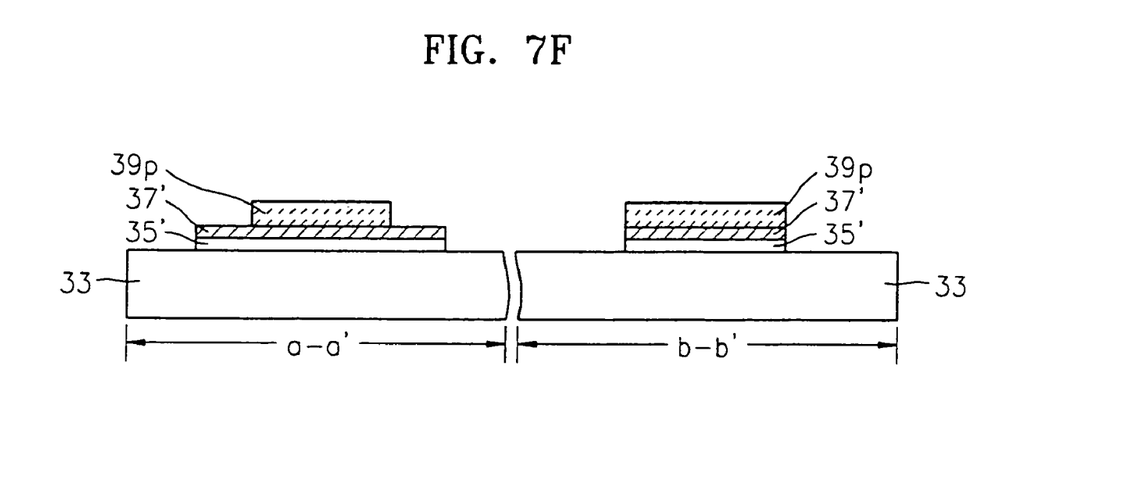
Figure 7G:
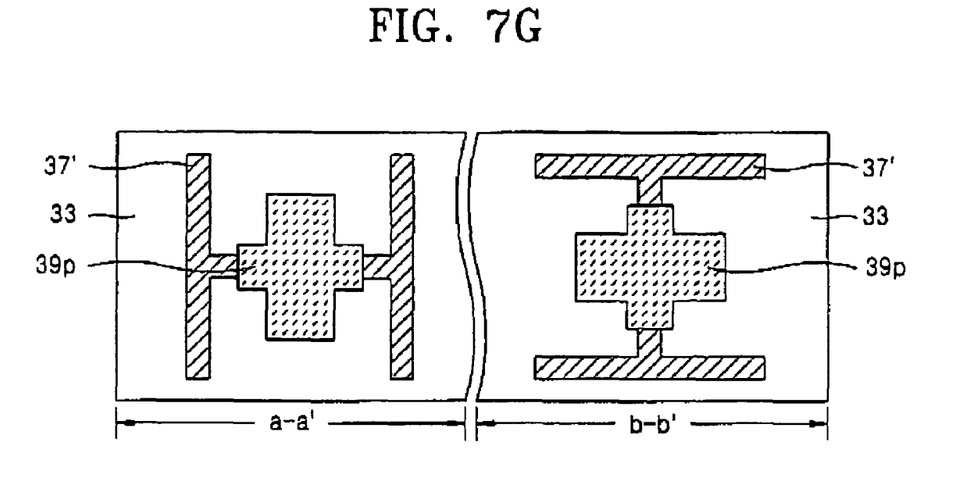

Next, as shown in FIG. 7F, the second photoresist pattern 39p is formed using an E-beam apparatus for manufacturing masks. The second photoresist pattern 39p is formed using the layout data of the opaque pattern, which was created in step S230 of FIG. 2. A top view of the thus formed second photoresist pattern 39p is shown in FIG. 7G.

Figure 7H:
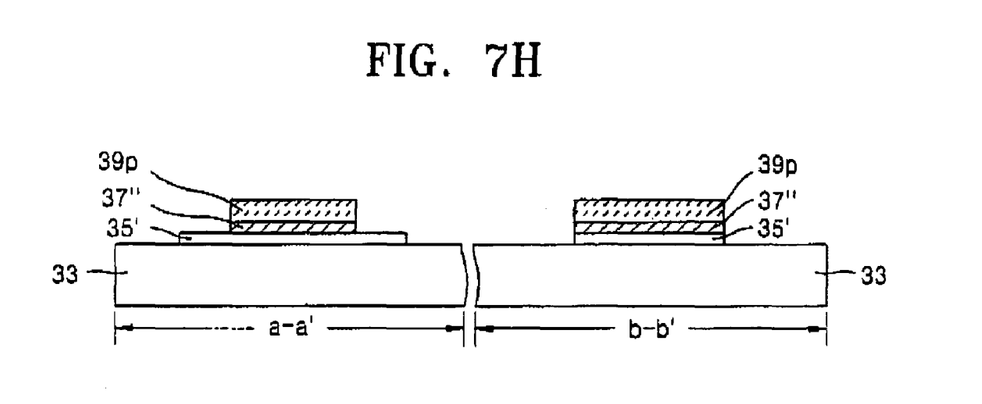
Figure 7I:
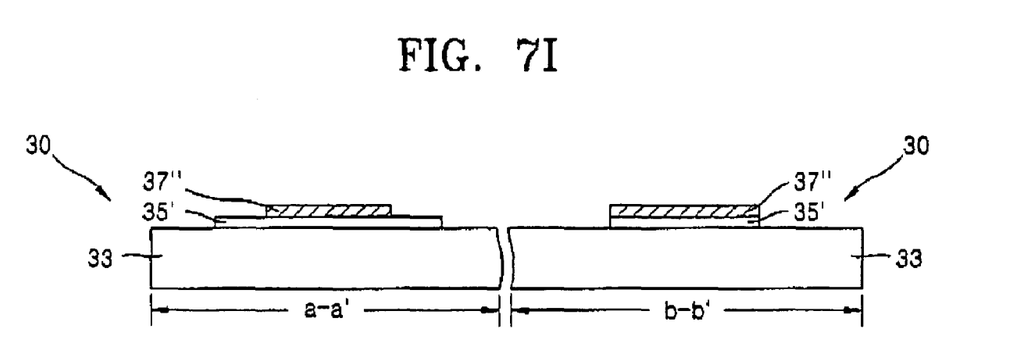

As shown in FIG. 7H, the opaque film 37' is etched using the second photoresist pattern 39p as an etching mask so that a final opaque pattern 37" can be formed. The HPSTM 30 of the present invention is completed by removing the second photoresist pattern 39p as shown in FIG. 7I.

According to the above-described manufacturing method, if the second photoresist pattern 39p is not accurately arranged over the opaque pattern 37', a final opaque pattern 37" may be different from the original layout and this can be a problem. In order to solve such a problem, the virtual layer 600 of FIG. 6 is formed during the manufacture of the mask.

Referring to FIGS. 8A to 8E, the manufacturing method of the HPSTM 30 using the virtual layer 600 is described.

Figure 8A:
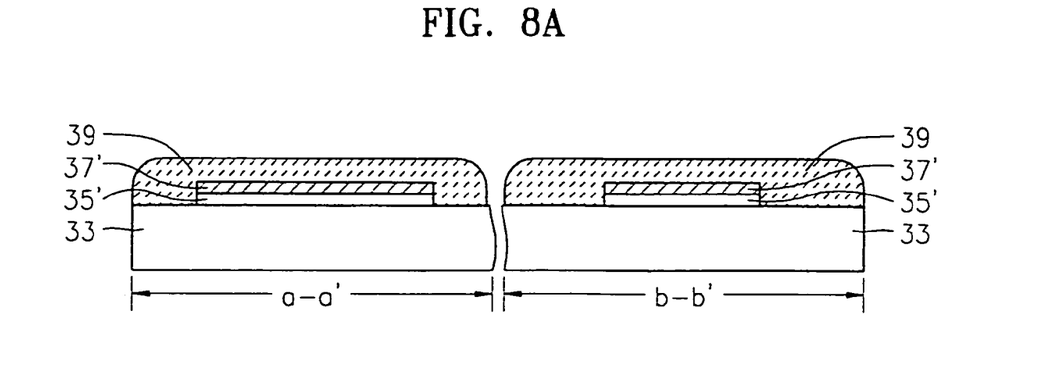
FIGS. 8A to 8E are a cross-sectional view and top views illustrating processes of manufacturing the masks using layout data input to a mask manufacturing apparatus though the flowchart of FIG. 5.

As shown in FIG. 8A, the second photoresist film 39 is formed on the transparent substrate 33, where the opaque film 37' and the halftone pattern 35' are formed thereon using processes shown in FIGS. 7A to 7E.

Figure 8B:
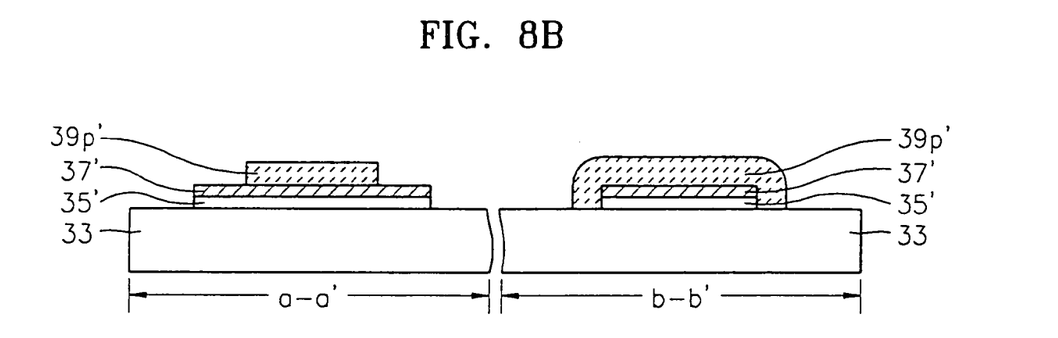
Figure 8C:
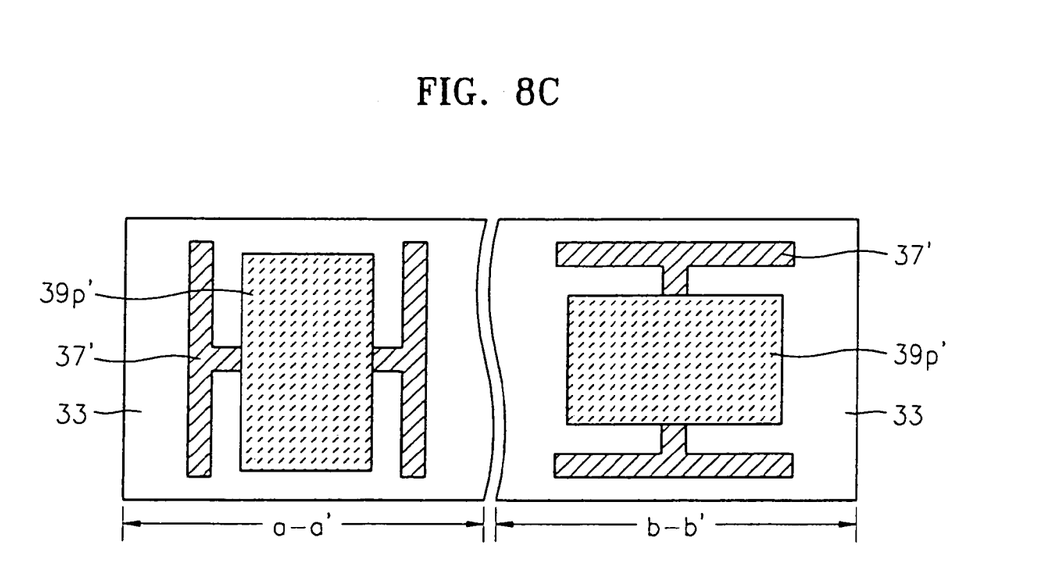

Referring to FIG. 8B, a second photoresist pattern 39p' is formed using an E-beam apparatus to which the virtual layer layout data created in step S540 of FIG. 5 are inputted. A top view of the thus formed second photoresist pattern 39p' is shown in FIG. 8C.

Figure 8D:
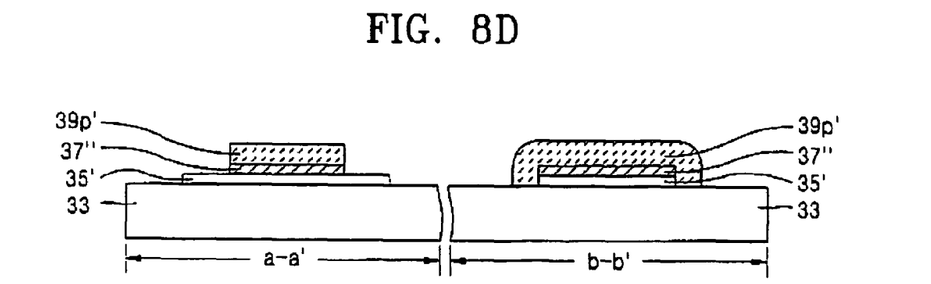
Figure 8E:
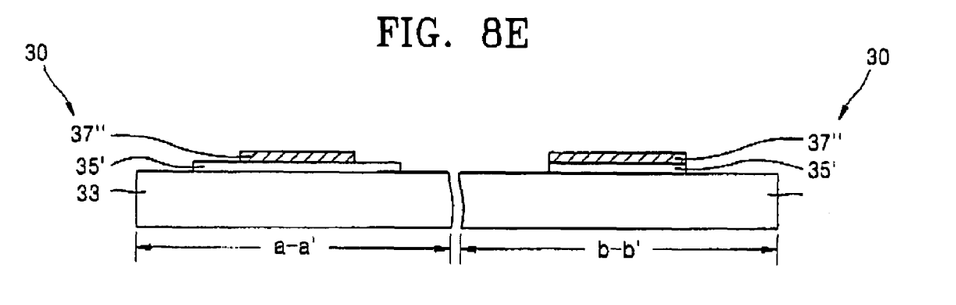

As shown in FIG. 8D, the exposed opaque pattern 37' is etched using the second photoresist pattern 39p' as an etching mask so that a final opaque pattern 37" can be formed. The HPSTM 30 of the present invention is completed by removing the second photoresist pattern 39p' as shown in FIG. 8E.

In the above-described manufacturing method, if the second photoresist pattern 39p' is formed using the data of the virtual layer 600, which defines a boundary of the opaque pattern and the halftone pattern considering the misalignment margin of the E-beam apparatus, the final opaque pattern 37" can be formed as the original layout. Further, the manufacturing margin of the mask can be increased.

Hereinafter, an experimental example and comparisons are described to illustrate the advantageous use of the set of masks according to an embodiment of the present invention. It will be, however, understood that experimental examples and comparisons can be modified in various ways depending on the types of integrated circuit devices.

EXPERIMENTAL EXAMPLE 1

Figure 9A:
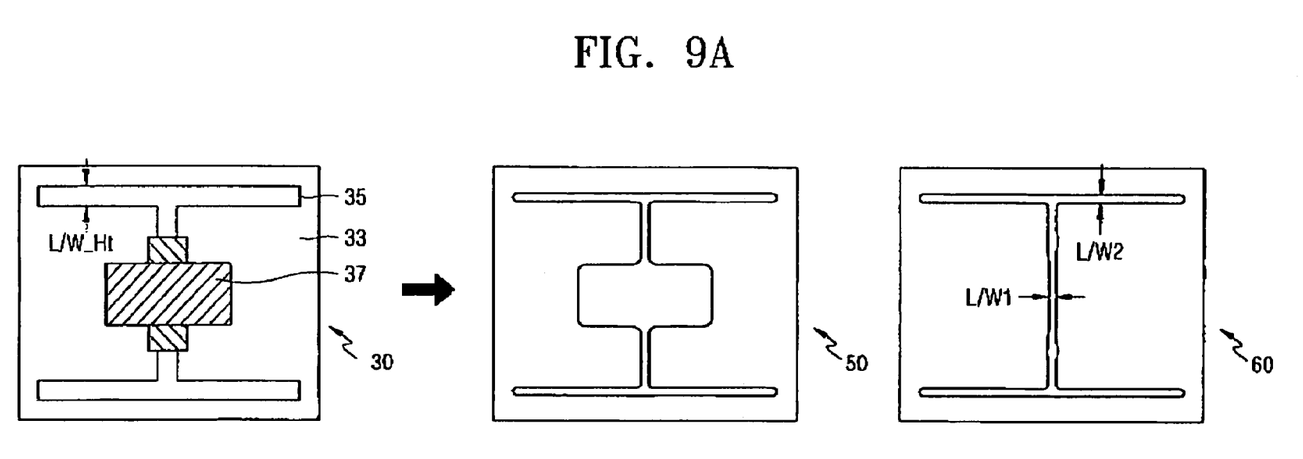
FIGS. 9A to 9D are layouts of a trim mask according to an embodiment of the present invention, a structure mask of a prior art, and images created by the masks.

A mask image of the APSM 20 (FIG. 1) in which the opaque line pattern 25 has a line width L/W1' of 0.36 μm and a mask image of the HPSTM 30 (FIG. 1) in which the halftone pattern 35 has a line width L/W_Ht of 0.481 μm were simulated, as shown in FIG. 9A. The APSM 20 and the HPSTM 30 were simulated, provided that a ¼ scale-down stepper adapting an exposure source having a wavelength of 248 nm was used. As a result, a HPSTM image 50 and a final image 60 were obtained. In the final image 60, a line width L/W1 of an access gate was 0.09 μm, and a line width L/W2 of a pass gate was 0.11 μm. Accordingly, it is understood that both the access gate image and the pass gate image were well formed.

COMPARATIVE EXAMPLE 1

Figure 9B:
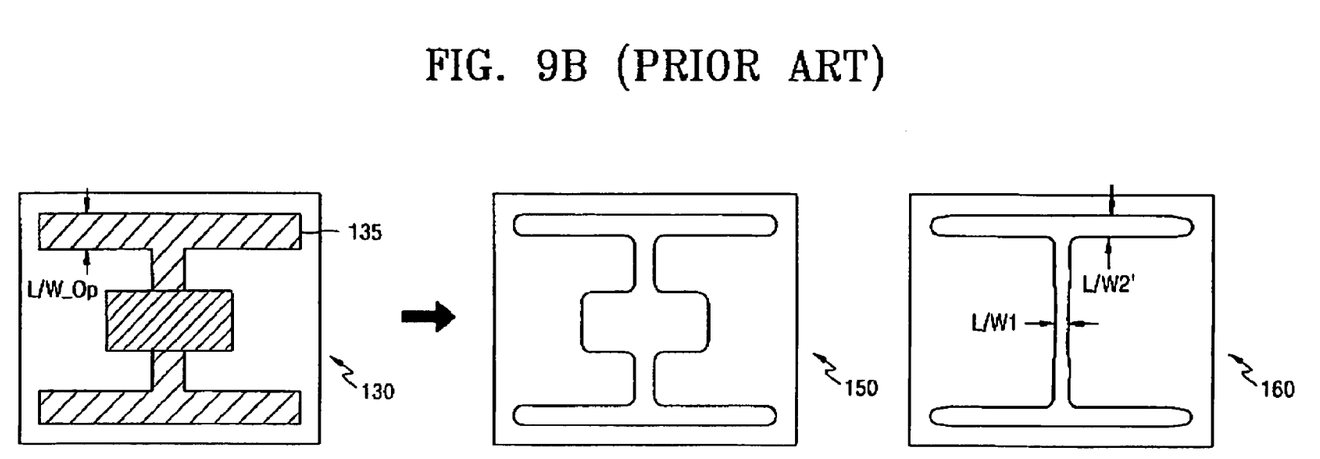

The APSM 20 used in the experimental example 1 and a single phase structure mask (SPSM) 130 disclosed in U.S. Pat. No. 5,858,580 were simulated under the same conditions as experimental example 1, as shown in FIG. 9B. A SPSM 130 in which a Cr pattern 135 has a line width L/W_Op of 0.8 μm was used. As a result, a SPSM image 150 and a final image 160 were obtained. As seen from the final image 160 of FIG. 9B, in a case of using the conventional set of masks, while a line width L/W1 of an access gate was reduced, a line width L/W2' of a pass gate was considerably larger than that of case of using the set of masks according to the present invention. Accordingly, it is understood that it is limited to form a highly-integrated circuit device using the conventional set of masks on a small area.

COMPARATIVE EXAMPLE 2

Figure 9C:
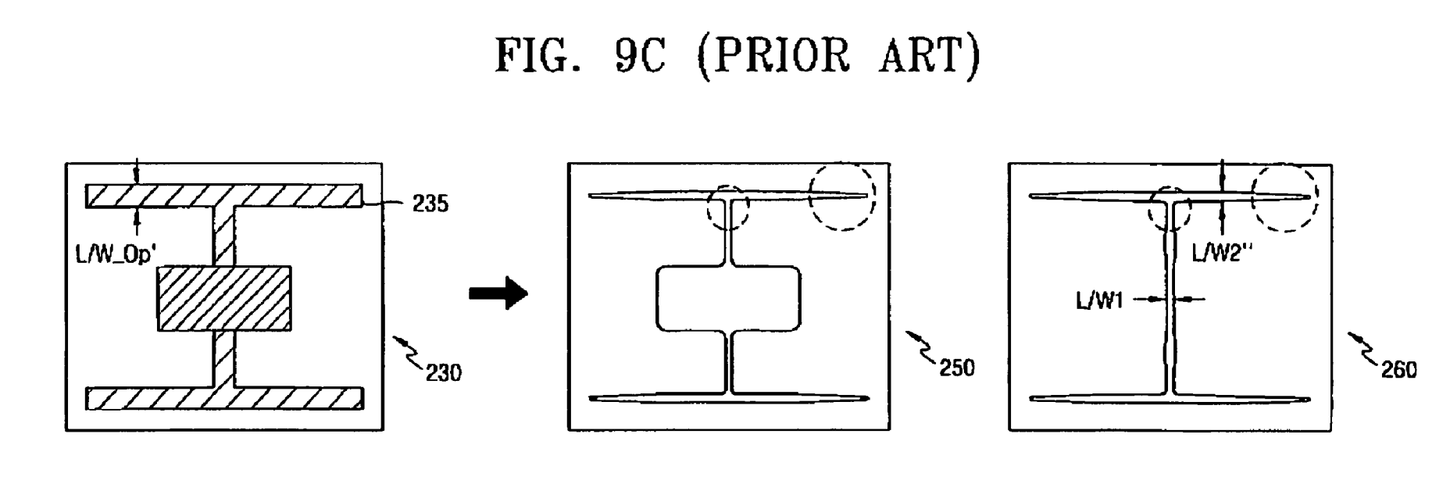

The APSM 20 used in experimental example 1 and a SPSM 230, in which the line width L/W_Op' of a chrome pattern 235 is the same as that of the halftone pattern 35 of the HPSTM 30 according to the present invention, were simulated under the same conditions as experimental example 1, as shown in FIG. 9C. As a result, a SPSM image 250 and a final image 260 were obtained. As indicated by the circles of the SPSM image 250 and the final image 260 of FIG. 9C, in a case where the pass gate having a reduced line width L/W2" was formed using the conventional set of masks, the pass gate image was poor, and the line width the poor pass gate image was not uniform. Since the line width was not uniform, as the described above, signal transmission is not good, thereby adversely affecting the characteristics of a highly-integrated circuit device. Further, since chrome is very weak in process changes such as defocus, there is a problem of the pass gate of the final image being cut in a case of reducing the line width of the chrome pattern as in the present invention.

Figure 9D:
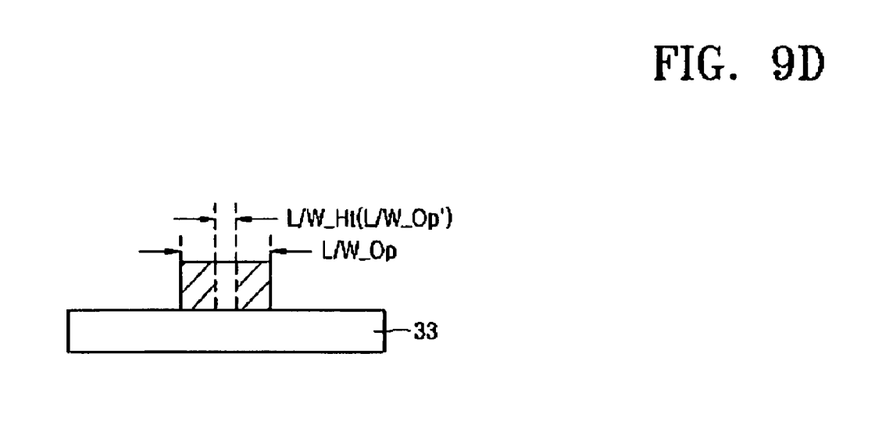

FIG. 9D is a cross-sectional view for comparing the line width of the halftone pattern of experimental example 1 with the line widths of the Cr patterns of comparative examples 1 and 2.

As described above, by using a set of masks according to the present invention, both an access interconnection line and a pass interconnection line can be formed with a minimum line width. As a result, a highly-integrated circuit device can be formed on a small area.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of creating a layout of a set of masks, the method comprising:

reading layout data of an interconnection line that has a large line width;

identifying an area from the read layout data in which an access interconnection line is formed by destructive light interference to have a line width smaller than the large line width;

creating a layout of an alternating phase shifting mask (APSM) having first and second phase shifting areas based on the identification, the first and second phase shifting areas having different phases and being disposed adjacent to each other to generate the destructive light interference; and creating a layout of a halftone phase shifting trim mask (HPSTM) that has an opaque pattern to prevent the access interconnection line defined by the APSM from being erased, and a halftone pattern defining a pass interconnection line, which has a line width smaller than the large line width and is connected to the access interconnection line, wherein the line width of the pass interconnection line is no greater than that of the access interconnection line.

2. The method of claim 1, wherein the opaque pattern corresponding to the first and second phase shifting areas includes:

a main block pattern disposed on the HPSTM to overlap the corresponding first and second phase shifting areas, the main block pattern having a plurality of edges, the edges being separated from corresponding edges of the first and second phase shifting areas by a misalignment margin required when double exposing the APSM and the HPSTM; and a sub-block pattern disposed on the HPSTM that extends from the main block pattern corresponding to the access interconnection line and prevents the access interconnection line from being erased.

3. The method of claim 1, wherein the first and second phase shifting areas further include an opaque line pattern between the first and second phase shifting areas of different phases, and the opaque line pattern has a width to determine the line width of the access interconnection line with a combination of light shielding of the opaque line pattern and the destructive light interference between the first and second phase shifting areas.

4. A method of creating a layout of a set of masks, the method comprising:

reading layout data of an interconnection line that has a large line width;

identifying an area from the read layout data in which an access interconnection line is formed by destructive light interference to have a line width smaller than the large line width;

creating a layout of an alternating phase shifting mask (APSM) having first and second phase shifting areas based on the identification, the first and second phase shifting areas having different phases and being disposed adjacent to each other to generate the destructive light interference;

creating a layout of a halftone phase shifting trim mask (HPSTM) that has an opaque pattern, which prevents the access interconnection line defined by the APSM from being erased, and a halftone pattern defining a pass interconnection line that has a line width smaller than the large line width and is connected to the access interconnection line; and creating a layout of a virtual layer that defines a boundary of the opaque pattern and the halftone pattern considering a misalignment margin of an HPSTM manufacturing apparatus, wherein the line width of the pass interconnection line is no greater than that of the access interconnection line.

5. The method of claim 4, wherein the first and second phase shifting areas further include an opaque line pattern between the first and second phase shifting areas of different phases, and the opaque line pattern has a width to determine the line width of the access interconnection line with a combination of light shielding of the opaque line pattern and the destructive light interference between the first and second phase shifting areas.

6. The method of claim 4, wherein the opaque pattern corresponding to the first and second phase shifting areas includes:

a main block pattern disposed on the HPSTM to overlap the corresponding first and second phase shifting areas, the main block pattern having a plurality of edges, the edges being separated from corresponding edges of the first and second phase shifting areas by a misalignment margin required when double exposing the APSM and the HPSTM; and a sub-block pattern disposed on the HPSTM that extends from the main block pattern corresponding to the access interconnection line and prevents the access interconnection line from being erased.

7. The method of claim 6, wherein the access interconnection line forms an access gate of an active device, and a line width of the main block pattern is greater than a line width of an active area of the active device.

8. The method of claim 6, wherein the sub-block pattern extends from both sides of the access interconnection line by another misalignment margin.

9. The method of claim 6, wherein the sub-block pattern extends from ends of the main block pattern aligning with ends of the first and second phase shifting areas.

10. The method of claim 9, further including laying out a virtual layer overlying the opaque pattern for making the set of masks, the virtual layer defining edges, wherein a common boundary of the sub-block pattern and the halftone pattern aligns with a portion of the edges of the virtual layer, and remaining edges of the virtual layer extend from the main block pattern by a misalignment margin of an apparatus used in manufacturing the HPSTM.

11. The method of claim 6, wherein the sub-block pattern extends from ends of the main block pattern, and further extends outwardly from the edges of the first and second phase shifting areas by no more than the wavelength of an exposure source used for the set of masks.

12. The method of claim 11, further including laying out a virtual layer overlying the opaque pattern for making the set of masks, the virtual layer defining edges, wherein a common boundary of the sub-block pattern and the halftone pattern aligns with a portion of the edges of the virtual layer, and remaining edges of the virtual layer extend from the main block pattern by a misalignment margin of an apparatus used in manufacturing the HPSTM.

* * * * *